United States Patent
Fan

(10) Patent No.: US 10,903,807 B2
(45) Date of Patent: Jan. 26, 2021

(54) MIXER CIRCUIT

(71) Applicant: Fan Fan, Nantong (CN)

(72) Inventor: Fan Fan, Nantong (CN)

( * ) Notice: Subject to any disclaimer, the term of this patent is extended or adjusted under 35 U.S.C. 154(b) by 0 days.

(21) Appl. No.: 16/770,635

(22) PCT Filed: Aug. 23, 2018

(86) PCT No.: PCT/CN2018/101925
§ 371 (c)(1),
(2) Date: Jun. 8, 2020

(87) PCT Pub. No.: WO2020/000614
PCT Pub. Date: Jan. 2, 2020

(65) Prior Publication Data
US 2020/0373894 A1    Nov. 26, 2020

(30) Foreign Application Priority Data

Jun. 29, 2018  (CN) .......................... 2018 1 0715381

(51) Int. Cl.
*H03F 3/45*       (2006.01)
*H03D 7/12*       (2006.01)

(52) U.S. Cl.
CPC ......... *H03F 3/45179* (2013.01); *H03D 7/125* (2013.01)

(58) Field of Classification Search
CPC ........................... H03F 3/45179; H03D 7/125
USPC ................................................ 327/355, 356
See application file for complete search history.

(56) References Cited

U.S. PATENT DOCUMENTS

2004/0227559 A1 * 11/2004 Erba ...................... H03C 1/547
                                                                327/356
2010/0164595 A1 *  7/2010 Radice ................. H03D 7/1441
                                                                327/356

FOREIGN PATENT DOCUMENTS

| CN | 103339865 A | 10/2013 |
|----|-------------|---------|
| CN | 103684268 A | 3/2014  |
| CN | 107834980 A | 3/2018  |
| CN | 108039869 A | 5/2018  |

OTHER PUBLICATIONS

ISR of PCT/CN2018/101925.

* cited by examiner

*Primary Examiner* — Tomi Skibinski
(74) *Attorney, Agent, or Firm* — HYIP

(57) ABSTRACT

The invention relates to a mixer circuit, which includes a transconductance stage circuit, a switch stage circuit and a load stage circuit which are electrically connected in sequence. The transconductance stage circuit is used to access a radio frequency voltage signal and convert the radio frequency voltage signal into a radio frequency current signal The switch-level circuit is used to access the local oscillator signal and the radio frequency current signal, and the switch-level transistor is turned on by using the local oscillator signal; the load-level circuit is used to convert the intermediate frequency current signal into a voltage signal for output. In the present invention, the transconductance stage circuit adopts a transistor superposition technology structure, which improves the conversion gain of the mixer; at the same time, it uses a source degenerate inductance structure, which further improves the conversion gain and linearity of the circuit.

4 Claims, 3 Drawing Sheets

MIXER CIRCUIT

TECHNOSPHERE

The invention relates to a radio frequency front-end integrated circuit, in particular to a mixer circuit in a radio frequency front-end receiver.

BACKGROUND TECHNOLOGY

Since the 21st century, the rapid development of wireless communication technology, people's demand for communication equipment is also increasing. The radio frequency receiver is an important module of wireless communication, and its performance index affects the entire wireless communication system. Among them, the design of the mixer plays an important role in the RF transceiver system. The performance index of the mixer affects the performance index of the entire RF front-end. Therefore, improving the performance of the mixer has important significance. The weak signal present on the RF receiver is first amplified by a low-noise amplifier and then transmitted to the mixer. Therefore, in the design of the mixer, it is necessary to comprehensively consider the conversion gain, noise, linearity, isolation and other performance indicators, and compromise the performance parameters of the mixer. The traditional Gilbert mixer circuit can only provide a certain conversion gain, noise and linearity. Therefore, a high-performance mixer circuit has become a current research hotspot.

CONTENTS OF THE INVENTION

In order to solve the above technical problems, the object of the present invention is to provide a high-gain mixer circuit.

The technical scheme adopted by the present invention is as follows: A mixer includes a transconductance stage circuit, a switch stage circuit and a load stage circuit which are electrically connected in sequence. Transconductance stage circuit, which is used to access the radio frequency voltage signal and convert the radio frequency voltage signal into a radio frequency current signal; switch stage circuit, which is used to access the local oscillator signal and the radio frequency current signal, and use the local oscillator signal to control the switching stage transistor Turn on, output intermediate frequency current signal; load level circuit, which is used to convert intermediate frequency current signal into voltage signal for output.

The transconductance stage circuit includes a transistor M1, a transistor M2, a transistor M3, a transistor M4, an inductor L1, an inductor L2, and an inductor L3; the gate of the transistor M1 is connected to the positive terminal RF+ of the radio frequency voltage signal, and the drain of the transistor M1 is connected to the transistor M2 The drain is connected, the source of the transistor M1 is connected to one end of the inductor L2, and the other end of the inductor L2 is grounded; the gate of the transistor M2 is connected to the gate of the transistor M1, and the source of the transistor M2 is grounded.

The gate of transistor M4 is connected to the negative terminal RF− of the RF voltage signal, the drain of transistor M4 is connected to the drain of transistor M3, the source of transistor M4 is connected to one end of inductor L3, and the other end of inductor L3 is grounded; transistor M3 Is connected to the gate of the transistor M4, and the source of the transistor M3 is grounded; one end of the inductor L1 is connected to the drain of the transistor M1, and the other end is connected to the drain of the transistor M4.

The switching stage circuit includes a transistor M5, a transistor M6, a transistor M7, a transistor M8, a gate of the transistor M5 is connected to the positive terminal LO+ of the local oscillation signal, a source of the transistor M5 is connected to the drain of the transistor M1, and a drain of the transistor M5 The pole is connected to the load stage circuit; the gate of the transistor M6 is connected to the negative terminal LO− of the local oscillator signal, the source of the transistor M6 is connected to the source of the transistor M5, and the drain of the transistor M6 is connected to the drain of the transistor M8; The gate of the transistor M7 is connected to the negative terminal LO− of the LO signal, the source of the transistor M7 is connected to the drain of the transistor M4, and the drain of the transistor M7 is connected to the drain of the transistor M5; the transistor M8 The gate is connected to the negative terminal LO+ of the local oscillation signal, the source of the transistor M8 is connected to the drain of the transistor M4, and the drain of the transistor M8 is connected to the load stage circuit.

The load stage circuit includes a resistor R1, a resistor R2, a transistor M9 and a transistor M10; the gate of the transistor M9 is connected to the gate of the transistor M10, one end of the resistor R1 is connected to the gate of the transistor M9, and the other end is connected to the source of the transistor M9, The source of transistor M9 is connected to the drain of transistor M5, the drain of transistor M9 is connected to the power supply voltage; one end of resistor R2 is connected to the gate of transistor M10, the other end is connected to the source of transistor M10, and the source of transistor M10 It is connected to the drain of the transistor M8, and the drain of the transistor M10 is connected to the power supply voltage. The transistors M1, M2, M3, M4, M5, M6, M7, M8, M9, M10 are all NMOS transistors.

The beneficial effect of the present invention is that in the mixer circuit of the present invention, the transconductance stage circuit adopts a transistor superposition structure, so that one of the transconductance stage transistors works in the saturation region and the other works in the sub-threshold region. The third-order transconductance coefficients of the transistors can be eliminated from each other, thereby improving the conversion gain and linearity of the circuit; the transconductance stage also uses a source degenerate inductance structure, which further improves the conversion gain and linearity of the circuit. The switch-level circuit is connected to the local oscillator signal, and the transistor is turned on in turn under the control of the large local oscillator signal, and the current is switched and modulated to realize the frequency conversion. The load-level circuit uses an active load, which can improve the conversion gain and linearity of the mixer circuit, and can also prevent the conversion gain from decreasing at high local oscillator power. In the mixer circuit of the present invention, the conversion gain is higher.

FIGURE ILLUSTRATION

SPECIFIC IMPLEMENTATION MODALITIES

Figure 1:
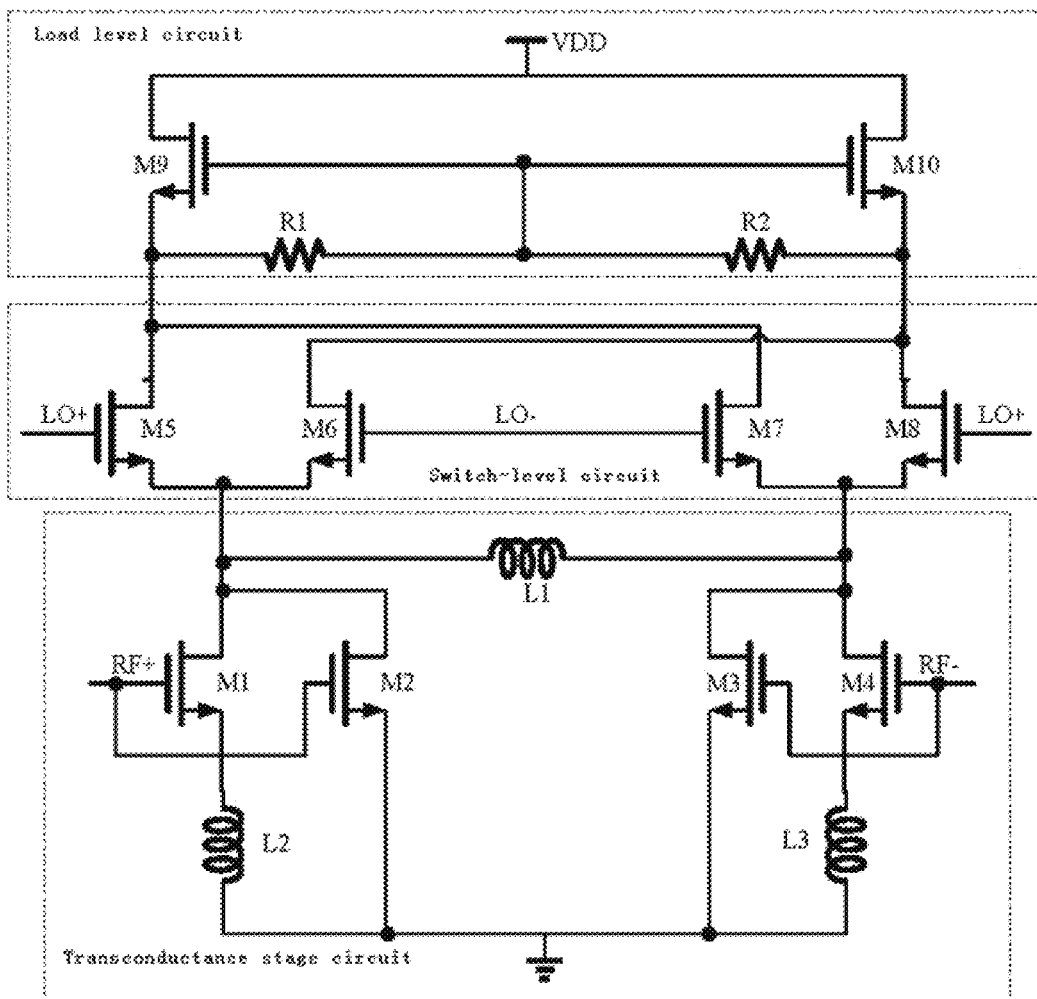
FIG. 1 is a circuit schematic diagram of the mixer of the present invention.

The principles and features of the present invention will be described below in conjunction with the drawings. The examples given are only used to explain the present invention, not to limit the scope of the present invention. As shown in FIG. 1, the mixer circuit includes a transconductance stage circuit, a switch stage circuit, and a load stage circuit that are electrically connected in sequence. The transconductance stage circuit uses a transistor superposition structure and a source degenerate inductance structure for accessing the RF voltage signal, And the radio frequency voltage signal is converted into a radio frequency current signal, and the radio frequency current signal is used repeatedly; the switch-level circuit is used to access the local oscillator signal and the radio frequency current signal, and the local oscillator signal is used to control the switching stage transistor to turn on; the load level The circuit is used to convert the intermediate frequency current signal into a voltage signal for output.

Specifically: the transconductance stage circuit includes a transistor M1, a transistor M2, a transistor M3, a transistor M4, an inductor L1, an inductor L2, and an inductor L3; the gate of the transistor M1 is connected to the positive terminal RF+ of the RF voltage signal, and the drain of the transistor M1 The drain of the transistor M2 is connected, the source of the transistor M1 is connected to one end of the inductor L2, and the other end of the inductor L2 is grounded; the gate of the transistor M2 is connected to the gate of the transistor M1, and the source of the transistor M2 is grounded.

The gate of transistor M4 is connected to the negative terminal RF- of the RF voltage signal, the drain of transistor M4 is connected to the drain of transistor M3, the source of transistor M4 is connected to one end of inductor L3, and the other end of inductor L3 is grounded; transistor M3 Is connected to the gate of the transistor M4, and the source of the transistor M3 is grounded; one end of the inductor L1 is connected to the drain of the transistor M1, and the other end is connected to the drain of the transistor M4.

As shown in FIG. 1, the transconductance stage uses a derivative superposition technology structure. By setting different bias voltages to operate the transistors M1 and M4 in the saturation region and M2 and M3 in the sub-threshold region, the third-order transconductance coefficients can be made mutually Eliminate and improve the conversion gain and linearity of the circuit. The current of MOS tube M1 is:

$$i_1 = \frac{1}{2}u_n C_{OX} \frac{W}{L} \frac{2(V_{GS} - V_{TH}) + \theta(V_{GS} - V_{TH})^2}{(1 + \theta(V_{GS} - V_{TH}))^2} v_{gs} + \frac{1}{2}u_n C_{OX} \frac{W}{L} \frac{-\theta}{(1 + \theta(V_{GS} - V_{TH}))^4} v_{gs}^3 \quad (1)$$

The current of MOS tube M2 can be expressed as:

$$i_2 = I_0 \frac{1}{\xi V_T} \exp\frac{V_{GS}}{\xi V_T} v_{gs} + I_0 \frac{1}{6(\xi V_T)^3} \exp\frac{V_{GS}}{\xi V_T} v_{gs}^3 \quad (2)$$

In the above formula, I0 represents the characteristic current. The total current of the transconductance stage of the mixer is:

$$\begin{aligned} i_{total} &= \frac{1}{2}u_n C_{OX} \frac{W}{L} \frac{2(V_{GS} - V_{TH}) + \theta(V_{GS} - V_{TH})^2}{(1 + \theta(V_{GS} - V_{TH}))^2} v_{gs} \\ &+ \frac{1}{2}u_n C_{OX} \frac{W}{L} \frac{-\theta}{(1 + \theta(V_{GS} - V_{TH}))^4} v_{gs}^3 \\ &+ I_0 \frac{1}{\xi V_T} \exp\frac{V_{GS}}{\xi V_T} v_{gs} + I_0 \frac{1}{6(\xi V_T)^3} \exp\frac{V_{GS}}{\xi V_T} v_{gs}^3 \\ &= \left[\frac{1}{2}u_n C_{OX} \frac{W}{L} \frac{2(V_{GS} - V_{TH}) + \theta(V_{GS} - V_{TH})^2}{(1 + \theta(V_{GS} - V_{TH}))^2} + I_0 \frac{1}{\xi V_T} \exp\frac{V_{GS}}{\xi V_T}\right] v_{gs} \\ &+ \left[\frac{1}{2}u_n C_{OX} \frac{W}{L} \frac{-\theta}{(1 + \theta(V_{GS} - V_{TH}))^4} + I_0 \frac{1}{6(\xi V_T)^3} \exp\frac{V_{GS}}{\xi V_T}\right] v_{gs}^3 \end{aligned} \quad (3)$$

It can be found from the above formula that by setting different DC bias voltages to make the transconductance transistors work in different regions, the third-order transconductance coefficients of the two transistors can be opposite to each other. The third-order transconductance coefficients cancel each other out, and the conversion gain and linearity of the circuit are improved. The transconductance stage uses inductance L2, L3 for input impedance matching, and also makes the linearity of the circuit improved.

Specifically, the switch stage circuit includes a transistor M5, a transistor M6, a transistor M7, and a transistor M8, the gate of the transistor M5 is connected to the positive terminal LO+ of the local oscillation signal, the source of the transistor M5 is connected to the drain of the transistor M1, and the transistor The drain of M5 is connected to the load stage circuit; the gate of transistor M6 is connected to the negative terminal LO- of the local oscillator signal, the source of transistor M6 is connected to the source of transistor M5, and the drain of transistor M6 is connected to the drain of transistor M8 Connection; the gate of the transistor M7 is connected to the negative terminal LO- of the local oscillator signal, the source of the transistor M7 is connected to the drain of the transistor M4, the drain of the transistor M7 is connected to the drain of the transistor M5; the gate of the transistor M8 The pole is connected to the negative terminal LO+ of the local oscillation signal, the source of the transistor M8 is connected to the drain of the transistor M4, and the drain of the transistor M8 is connected to the load stage circuit.

The switch stage is connected to the local oscillator signal, and the transistor is turned on in turn under the control of the local oscillator large signal. When LO+ is turned on, transistor M5 and transistor M8 are turned on, and transistor M6 and transistor M7 are turned off; when LO- is turned on, The transistor M6 and the transistor M7 are turned on, and the transistor M5 and the transistor M8 are turned off, so as to switch and modulate the current to realize the frequency conversion.

Specifically: the load stage circuit includes a resistor R1, a resistor R2, a transistor M9 and a transistor M10; the gate of the transistor M9 is connected to the gate of the transistor M10, one end of the resistor R1 is connected to the gate of the transistor M9, and the other end is connected to the transistor M9 Source connection, the source of transistor M9 is connected to the drain of transistor M5, the drain of transistor M9 is connected to the power supply voltage; one end of resistor R2 is connected to the gate of transistor M10, and the other end is connected to the source of transistor M10, transistor M10 Is connected to the drain of the transistor M8, and the drain of the transistor M10 is connected to the power supply voltage. The transistors M1, M2, M3, M4, M5, M6, M7, M8, M9, M10 are all NMOS transistors.

The load stage of this circuit uses an active load. Due to the parasitic capacitance of the circuit, the size of the transistor cannot be too large, otherwise the power consumption of the circuit will also increase. Therefore, it is necessary to appropriately select the size of the transistor and comprehensively consider the performance parameters of the circuit. Active load can improve the conversion gain and linearity of the mixer circuit, and at high local oscillator power, can also avoid conversion gain reduction.

Figure 2:
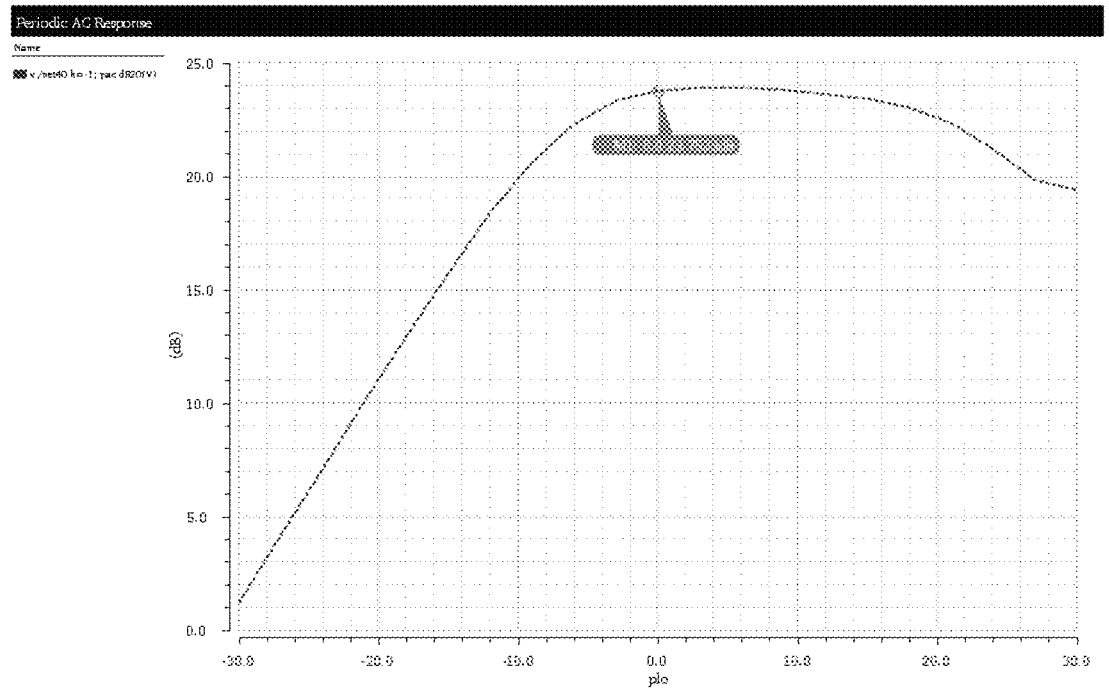
FIG. 2 is a simulation diagram of the conversion gain of the mixer of the present invention changing with the power of the local oscillator.

As shown in FIG. 2, it is a simulation diagram of the conversion gain of the mixer circuit of the present invention changing with the power of the local oscillator. It can be seen from the figure that the conversion gain of the mixer can reach 23.75 dB.

Figure 3:
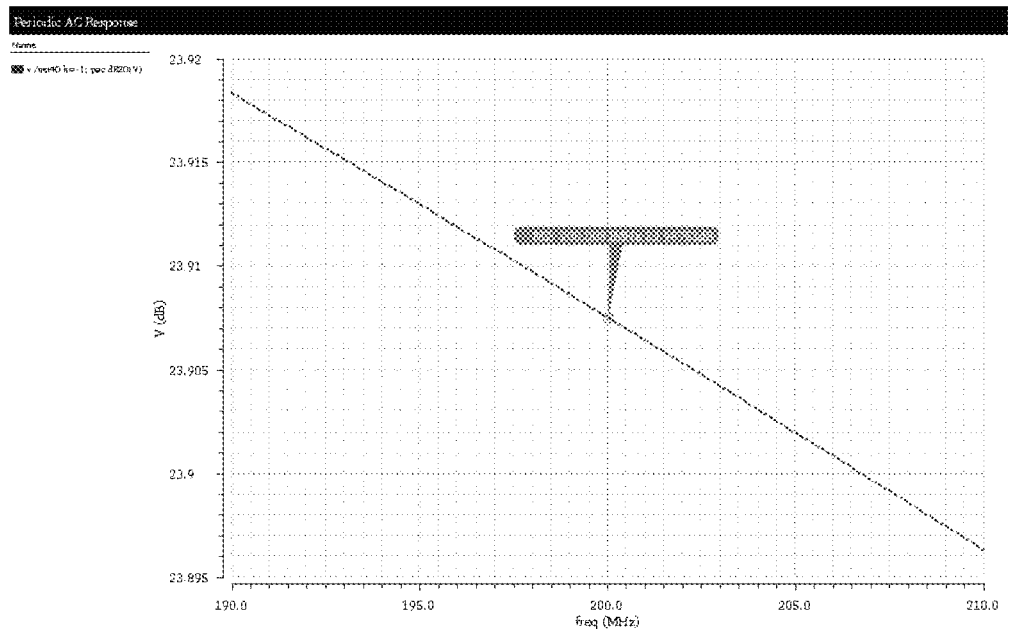
FIG. 3 is a simulation diagram of the conversion gain of the mixer of the present invention changing with the output frequency.

As shown in FIG. 3, it is a simulation diagram of the conversion gain of the mixer circuit of the present invention changing with the output frequency. As can be seen from the figure, the conversion gain of the mixer is 23.9 dB.

Figure 4:
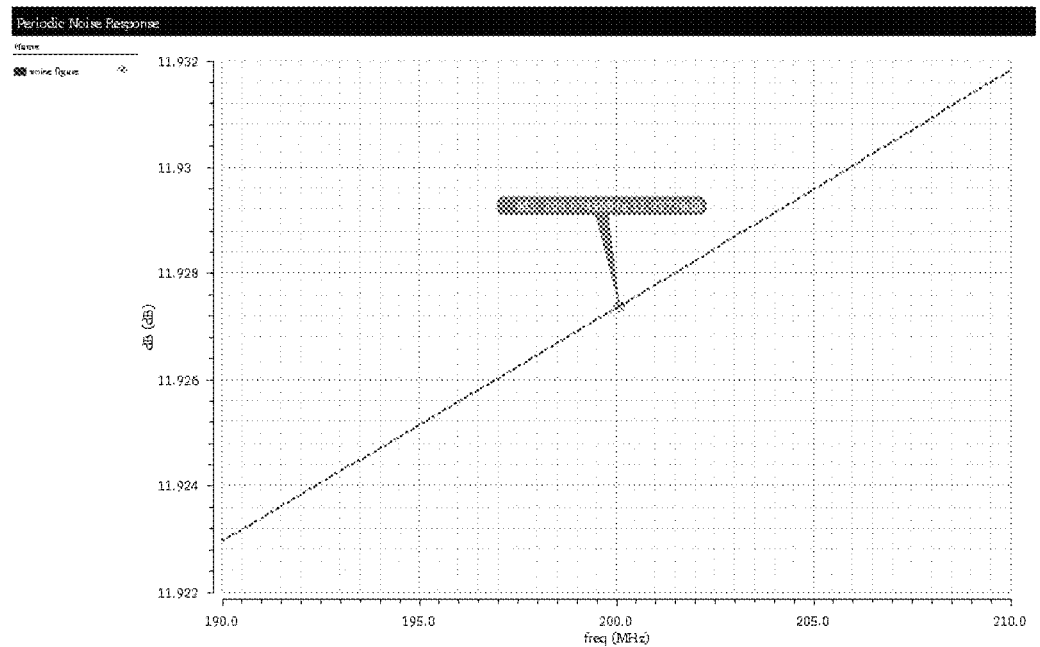
FIG. 4 is a graph of the noise figure simulation result of the mixer of the present invention.

FIG. 4 is a simulation diagram of the noise figure of the mixer circuit of the present invention. As can be seen from the figure, the noise figure of the mixer is 11.92 dB.

Figure 5:
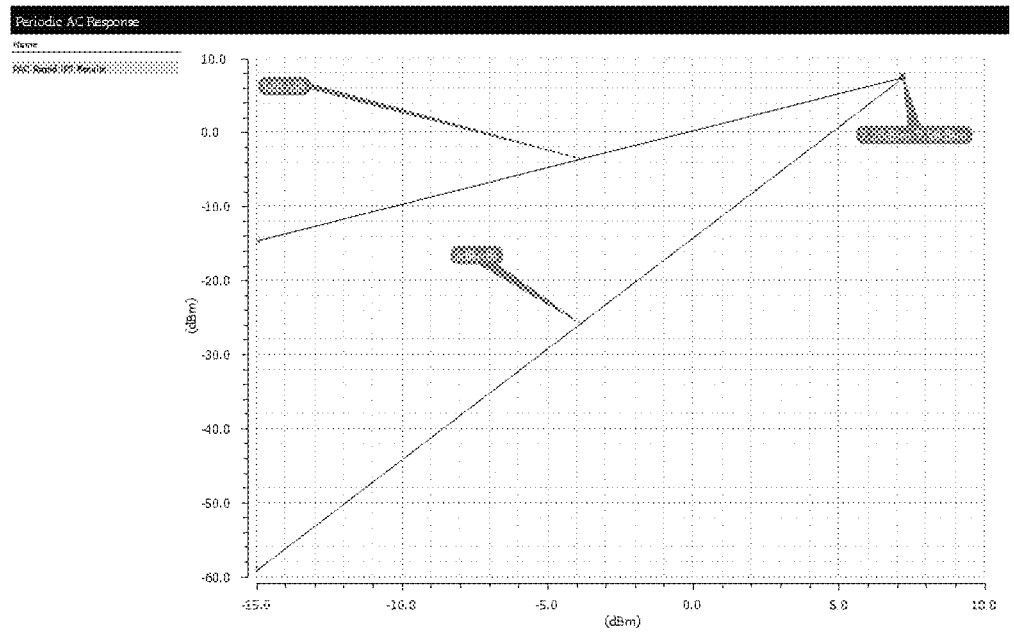
FIG. 5 is a graph of the linearity simulation result of the mixer of the present invention.

As shown in FIG. 5, it is a simulation diagram of the linearity of the mixer circuit of the present invention. It can be seen from the figure that the linearity of the mixer is 7.2 dBm.

In summary, the transconductance stage of the mixer circuit of the present invention adopts a transistor superposition structure, so that one of the transconductance stage transistors works in the saturation region and the other works in the sub-threshold region. Conductivity coefficients can be eliminated from each other, thereby improving the conversion gain and linearity of the circuit; the transconductance stage also uses a source degenerate inductance structure, which further improves the conversion gain and linearity of the circuit.

The invention adopts TSMC 0.18 um CMOS process parameters, and the circuit is simulated in Cadence Spectre. The size parameters of the circuit are shown in Table 1.

TABLE 1

Dimensional parameters of the circuit

| Device | Parameter |
| --- | --- |
| M1, M4 | 225 u/0.18 u |
| M2, M3 | 225 u/0.18 u |
| M5, M6 | 40 u/0.4 u |
| M7, M8 | 40 u/0.18 u |
| M9, M10 | 80 u/0.18 u |
| L1 | 1 n |
| L2, L3 | 1.5 n |
| R1, R2 | 1 K |

The performance of the mixer of the present invention is compared with other published mixers, as shown in Table 2.

TABLE 2

Performance comparison between the mixer of the present invention and other circuits

| Craftsmanship (nm) | Frequency (GHz) | Conversion gain (dB) | Noise FIG. (dB) | IIP3 dBm | Literature |
| --- | --- | --- | --- | --- | --- |
| 180 | 5.2 | 16.2 | 5.32 | −1.76 | [1] |
| 180 | 5.2 | 12 | 10.6 | 4 | [2] |
| 180 | 5.2 | 10.6 | 10 | −2 | [3] |
| 180 | 5.2 | 23.9 | 11.92 | 7.2 | This article |

The above are only preferred embodiments of the present invention and are not intended to limit the present invention. Any modification, equivalent replacement, improvement, etc. within the spirit and principle of the present invention should be included in the protection of the present invention Within range.

The invention claimed is:

1. A mixer circuit is characterized by including a transconductance stage circuit, a switch stage circuit and a load stage circuit which are electrically connected in sequence;
   The transconductance stage circuit uses a transistor superposition technology structure and a source degenerate inductance structure, which is used to access the radio frequency voltage signal and convert the radio frequency voltage signal into a radio frequency current signal;
   The switch stage circuit is used to access the local oscillator signal and the radio frequency current signal, and use the local oscillator signal to control the switch stage transistor to turn on in turn to output the intermediate frequency current signal;
   The load stage circuit is used to convert the intermediate frequency current signal into a voltage signal output;
   The transconductance stage circuit includes a transistor M1, a transistor M2, a transistor M3, a transistor M4, an inductor L1, an inductor L2, and an inductor L3; the gate of the transistor M1 is connected to the positive terminal RF+ of the radio frequency voltage signal, and the transistor M1 The drain is connected to the drain of the transistor M2, the source of the transistor M1 is connected to one end of the inductor L2, the other end of the inductor L2 is grounded; the gate of the transistor M2 is connected to the gate of the transistor M1, and the source of the transistor M2 is grounded;
   The gate of the transistor M4 is connected to the negative terminal RF− of the radio frequency voltage signal, the drain of the transistor M4 is connected to the drain of the transistor M3, the source of the transistor M4 is connected to one end of the inductor L3, and the other end is grounded; the gate of the transistor M3 is connected to the gate of the transistor M4, and the source of the transistor M3 is grounded; one end of the inductor L1 is connected to the drain of the transistor M1, and the other end is connected to the drain of the transistor M4.

2. The mixer circuit according to claim 1, wherein the switching stage circuit comprises a transistor M5, a transistor M6, a transistor M7, and a transistor M8, and the gate of the transistor M5 is connected to the positive terminal LO+ of the local oscillator signal, The source of the transistor M5 is connected to the drain of the transistor M1, the drain of the transistor M5 is connected to the load stage circuit; the gate of the transistor M6 is connected to the negative terminal LO− of the local oscillator signal, The source of the transistor M6 is connected to the source of the transistor M5, the drain of the transistor M6 is connected to the drain of the transistor M8; the gate of the transistor M7 is connected to the negative terminal LO of the local oscillator signal-Connection, the source of the transistor M7 is connected to the drain of the transistor M4, the drain of the transistor M7 is connected to the drain of the transistor M5; the gate of the transistor M8 is negative to the local oscillator signal Extreme LO+ connection, the source of the transistor M8 is connected to the drain of the transistor M4, and the drain of the transistor M8 is connected to the load stage circuit.

3. The mixer circuit according to claim 2, wherein the load stage circuit includes a resistor R1, a resistor R2, a transistor M9 and a transistor M10; the gate of the transistor M9 is connected to the gate of the transistor M10, so One end of the resistor R1 is connected to the gate of the transistor M9 and the other end is connected to the source of the transistor M9, The source of the transistor M9 is connected to the drain of the transistor M5, One end is connected to the gate of the transistor M10, the other end is connected to the source of the transistor M10, the source of the transistor M10 is connected to the drain of the transistor M8, and the drain of the transistor M10 is connected to the power supply voltage.

4. The mixer circuit according to claim 3, wherein the transistors M1, M2, M3, M4, M5, M6, M7, M8, M9, and M10 are all NMOS transistors.

* * * * *